US009752732B2

(12) United States Patent
Lee

(10) Patent No.: US 9,752,732 B2
(45) Date of Patent: Sep. 5, 2017

(54) TRANSPARENT ELECTRONIC DISPLAY BOARD AND METHOD FOR MANUFACTURING SAME

(71) Applicant: G-SMATT CO., LTD., Gyeonggi-do (KR)

(72) Inventor: Ho Jun Lee, Seoul (KR)

(73) Assignee: G-SMATT CO., LTD., Gyeonggi-Do (KR)

( * ) Notice: Subject to any disclaimer, the term of this patent is extended or adjusted under 35 U.S.C. 154(b) by 36 days.

(21) Appl. No.: 14/415,725

(22) PCT Filed: Nov. 27, 2012

(86) PCT No.: PCT/KR2012/010104
§ 371 (c)(1),
(2) Date: Jan. 19, 2015

(87) PCT Pub. No.: WO2014/014170
PCT Pub. Date: Jan. 23, 2014

(65) Prior Publication Data
US 2015/0176769 A1     Jun. 25, 2015

(30) Foreign Application Priority Data

Jul. 18, 2012  (KR) .................. 10-2012-0078117

(51) Int. Cl.
G09F 13/04       (2006.01)
G09F 13/08       (2006.01)
(Continued)

(52) U.S. Cl.
CPC ............... *F21K 9/10* (2013.01); *B32B 37/02* (2013.01); *B32B 37/16* (2013.01); *F21K 9/20* (2016.08);
(Continued)

(58) Field of Classification Search
CPC ........ F21K 9/10; F21K 9/90; F21Y 2105/005; F21Y 2111/008; F21Y 2105/001;
(Continued)

(56) References Cited

U.S. PATENT DOCUMENTS 6,331,063 B1 * 12/2001 Kamada .................... F21V 5/02
                                                          257/E25.02
7,714,500 B2 *  5/2010 Hirakata ............... H01L 25/048
                                                          313/504

(Continued)

FOREIGN PATENT DOCUMENTS

KR    10-2002-0016493 A    3/2002
KR    10-2006-0007270 A    1/2006
KR    10-2012-0009118 A    2/2012

OTHER PUBLICATIONS

International Search Report for PCT/KR2012/010103.

*Primary Examiner* — Alexander Garlen
(74) *Attorney, Agent, or Firm* — The PL Law Group, PLLC

(57) ABSTRACT

The present invention relates to a transparent electronic display board and a method of manufacturing the same. More particularly, the transparent electronic display board uses front light-emitting elements and rear light-emitting elements and/or both-sided light-emitting elements, whereby the number of light-emitting elements that can be installed in the transparent electronic display board can be increased. Thereby, the quality of an image displayed on the transparent electronic display board can be markedly improved.

5 Claims, 7 Drawing Sheets

(51) Int. Cl.
*F21K 99/00* (2016.01)
*G09F 9/33* (2006.01)
*B32B 37/02* (2006.01)
*B32B 37/16* (2006.01)
*F21K 9/90* (2016.01)
*H01L 33/42* (2010.01)
*F21K 9/20* (2016.01)
*G02F 1/1335* (2006.01)

(52) U.S. Cl.
CPC ............... *F21K 9/90* (2013.01); *G09F 9/33* (2013.01); *H01L 33/42* (2013.01); *B32B 2307/202* (2013.01); *B32B 2307/412* (2013.01); *B32B 2457/20* (2013.01); *G02F 1/133603* (2013.01)

(58) Field of Classification Search
CPC ............ G02F 1/133603; H01L 33/42; B32B 17/10036; B32B 2307/202; G06F 9/33
USPC ............................... 313/498–512
See application file for complete search history.

(56) References Cited

U.S. PATENT DOCUMENTS

| | | | |
|---|---|---|---|
| 2008/0079012 A1* | 4/2008 | Grote | B60Q 1/2696 257/89 |
| 2009/0114928 A1* | 5/2009 | Messere | B32B 17/10 257/88 |
| 2011/0058372 A1* | 3/2011 | Lerman | H05K 1/0204 362/235 |

* cited by examiner

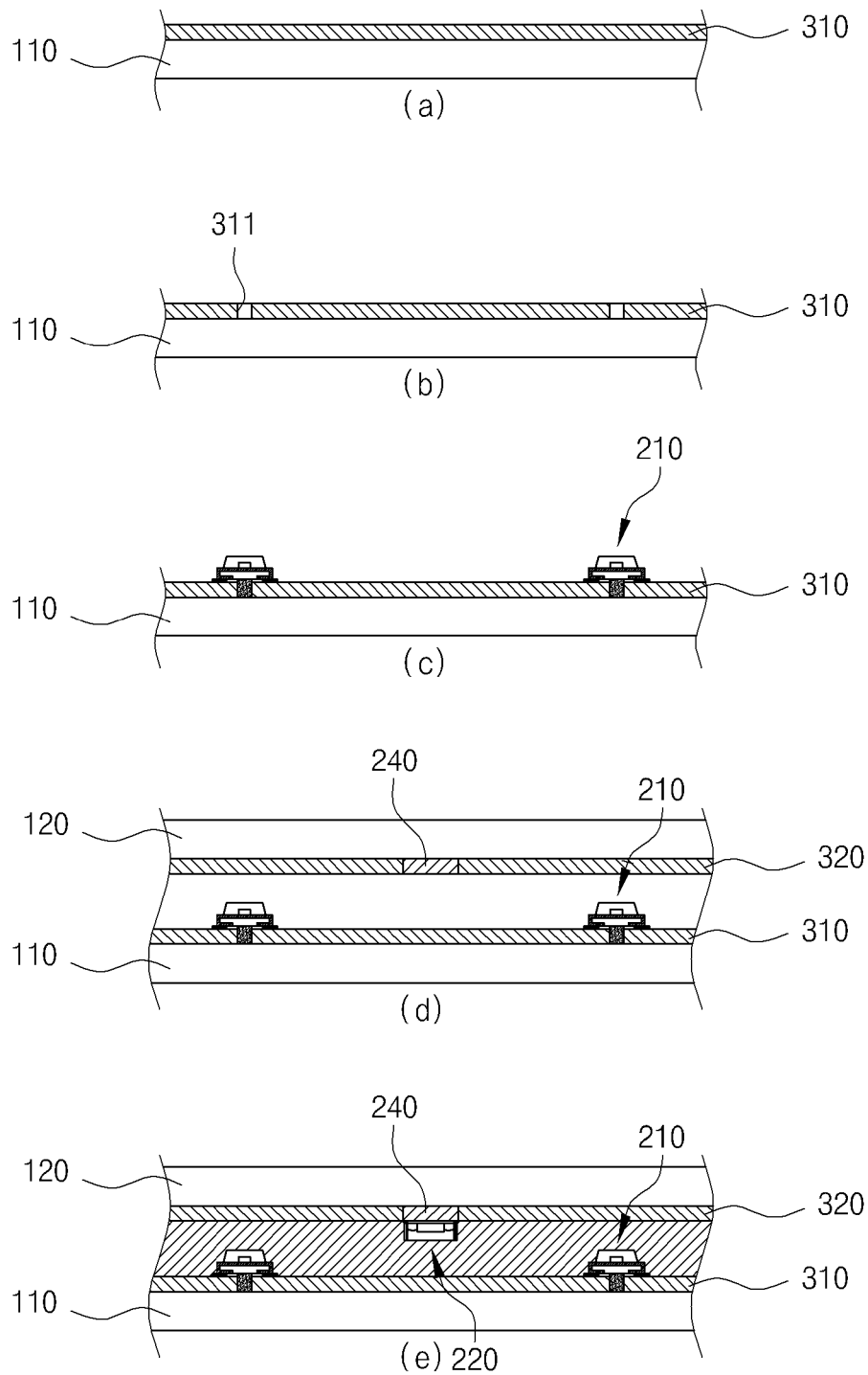

TRANSPARENT ELECTRONIC DISPLAY BOARD AND METHOD FOR MANUFACTURING SAME

CROSS REFERENCE TO RELATED APPLICATIONS AND CLAIM OF PRIORITY

This patent application claims benefit under 35 U.S.C. 119(e), 120, 121, or 365(c), and is a National Stage entry from International Application No. PCT/KR2012/010104, filed Nov. 27, 2012, which claims priority to Korean Patent Application No. 10-2012-0078117, filed Jul. 18, 2012, entire contents of which are incorporated herein by reference.

TECHNICAL FIELD

The present invention generally relates to transparent electronic display boards and methods of manufacturing the same. More particularly, the present invention relates to a transparent electronic display board that uses front light-emitting elements and rear light-emitting elements and/or both light-emitting elements so that the number of light-emitting elements that can be installed in the electronic display board can be increased, whereby the quality of an image displayed on the electronic display board can be improved, and to a method of manufacturing the transparent electronic display board.

BACKGROUND ART

Generally, light emitting devices such as neon lamps, CCLs (cold cathode lamps), LEDs (light emitting diodes), etc. are widely used in outdoor electronic display boards. EEFLs (external electrode fluorescent lamps), CCFLs (cold cathode fluorescent lamps), LED electronic displays, etc. are used as indoor light emitting devices.

Neon lamps or CCLs use high voltage power and thus have disadvantages of high power consumption, risks of electric shock or fire, and a short lifetime. On the other hand, EEFLs or CCFLs have problems in being used outdoor because they use high frequency. Furthermore, EEFLs or CCFLs have disadvantages of low intensity of illumination and a short lifetime.

Electronic display boards using LEDs are characterized in that light is emitted in one direction because a rear surface of the board that is opposed to a light emitting surface is covered with a cover for arrangement of wires or black background treatment.

Recently, light emitting devices are used not only as lighting but also as advertising signboards or interior decorations for beauty.

However, the above-mentioned light emitting devices are limited in enhancing aesthetic effects because of the size of a lamp or the size of a stand for supporting a light emitting device.

To enhance aesthetic effects, transparent electronic display boards were introduced, in which a plurality of light emitting elements provided on transparent electrodes emits light and thus displays text or a figure on the transparent electrode and plays a video under the control of a controller. In such a transparent electronic display board, a plurality of light emitting elements is wired on transparent electrodes. Typically, light emitting elements each having two, three or four electrodes are used. Of conventional transparent electronic display boards, a wiring diagram of a transparent electronic display board having four-electrode light emitting elements is illustrated in FIG. 1.

FIG. 1 is a perspective view showing a conventional transparent electronic display board. FIG. 2 is a sectional view of FIG. 1.

Referring to FIGS. 1 and 2, the conventional transparent electronic display board 1 includes: a pair of transparent plates 11 and 12 that are spaced apart from each other and adhered to each other by a transparent resin 40; a transparent electrode 30 that is formed by applying conductive material on surfaces of the transparent plates 11 and 12 that face each other and is able to transmit electric signals; light-emitting elements 20 that are adhered to the transparent electrode 30 by a conductive adhesive and non-conductive adhesive; and a transparent resin 40 that is injected into space between the transparent plates 11 and 12 including the light-emitting elements 20 so as to adhere the transparent plates 11 and 12 to each other and fix the light-emitting elements 20 in place.

The transparent plates 11 and 12 include: a first transparent plate 11 to one surface of which the transparent electrode 30 and the light-emitting elements 20 are fixed; and a second transparent plate 12 adhered to an upper surface of the first transparent plate 11.

The transparent electrode 30 is formed by applying any one of ITO (Indium Tin Oxide), IZO (Indium Zinc Oxide), and liquid polymer, which are conductive materials, to a surface of either transparent plate 11 or 12 that faces the other transparent plate 11 or 12.

After applied to the entirety of the surface of the first transparent plate 11, the transparent electrode 30 is partitioned into a plurality of parts to be connected to anode electrodes and cathode electrodes of the light-emitting elements.

Each light-emitting element 20 includes one or more anode electrodes and a cathode electrode. Furthermore, the light-emitting element 20 further includes: terminals 30 that are made of conductive metal and are provided to transmit an electric signal between the anode electrodes and the transparent electrode 30; a light-emitting chip 21 connected to and placed on the terminals 23; a lens 22 that is provided on an upper surface of the light-emitting chip 21 so as to diffuse light; a conductive adhesive 24 adhering the terminal 23 to the transparent electrode 30; and a non-conductive adhesive 25 that insulates partitioned parts of the transparent electrode 30 from each other and adheres the light-emitting element 20 to the transparent plate. The light-emitting element is a well known technique; therefore, further explanation of the construction and operation thereof will be omitted, but the structure of fastening light-emitting element to the transparent plate will be described in brief.

In the conventional transparent electronic display board, the transparent resin 40 is charged into space between the first transparent plate 11 and the second transparent plate 12 and then hardened to fix the light-emitting elements 20 on the surface of the first transparent plate 11 and protect the light-emitting elements 20.

The light-emitting element 20 comprises a front light-emitting element that emits light when an electric signal is applied thereto through the transparent electrode 30. Light emitted from the light-emitting element 20 is output to the outside through the transparent resin 40 and the second transparent plate 12.

The conventional transparent electronic display boards having the above-mentioned construction are installed on buildings, parks or indoor space to display numerals, letters or figures for advertisement or are widely used as decorations. Recently, transparent electronic display boards that can play videos were introduced, whereby the usefulness thereof is further increasing.

Here, to play a video using the transparent electronic display board, the number of light-emitting elements must be increased compared to that of the typical transparent electronic display board for displaying letters or figures, because the quality of displayed video images can be improved when the distance between the light-emitting elements is reduced. However, in the conventional transparent electronic display board, areas on which the transparent electrodes are wired must be considered in installation of the light-emitting elements on the surface of the first transparent plate 110. Thus, the number of light-emitting elements is limited. As such, the conventional transparent electronic display board is problematic in that there is a limit in reducing the distance between the light-emitting elements because the arrangement of the transparent electrodes and the areas for installation of the light-emitting elements are taken into account.

SUMMARY

Accordingly, the present invention has been made keeping in mind the above problems occurring in the prior art, and an object of the present invention is to provide a transparent electronic display board configured such that front light-emitting elements and rear light-emitting elements or front light-emitting elements and both-sided light-emitting elements are respectively installed on surfaces of a pair of transparent plates that face each other and are adhered to each other by transparent resin, whereby the distance between the light-emitting elements can be reduced, and the area of the entirety of the light-emitting elements installed on the transparent plates can be increased, and to a method of manufacturing the transparent electronic display board.

In order to accomplish the above object, the present invention may include the following embodiments.

A first embodiment according to the present invention provides a transparent electronic display board including: a first transparent plate and a second transparent plate facing each other at positions spaced apart from each other by a predetermined distance; a first transparent electrode and a second transparent electrode respectively provided on surfaces of the first and second transparent plates that face each other; one or more first light-emitting elements mounted on the first transparent plate and electrically connected to the first transparent electrode, the first light-emitting elements emitting light toward the second transparent plate; one or more second light-emitting elements mounted on the second transparent plate and electrically connected to the second transparent electrode, the second light-emitting elements emitting light toward the second transparent plate; and a transparent resin charging into a space between the first transparent plate and the second transparent plate and fastening the first and second transparent plates to each other.

In a second embodiment according to the present invention, each of the second light-emitting elements may comprise either a rear light-emitting element emitting light toward the second transparent plate or a both-sided light-emitting element simultaneously emitting light toward both the first transparent plate and the second transparent plate.

In a third embodiment according to the present invention, each of the first light-emitting elements may comprise either a front light-emitting element emitting light toward the second transparent plate or a both-sided light-emitting element simultaneously emitting light toward both the first transparent plate and the second transparent plate.

In a fourth embodiment according to the present invention, the rear light-emitting element or the both-sided light-emitting element may include a light-emitting chip including one or more electrodes, and one or more connection terminals electrically connected to the light-emitting chip, the connection terminals protruding rearward and adhered to the second transparent electrode by a transparent conductive adhesive.

In a fifth embodiment according to the present invention, the both-sided light-emitting element may include: a first light-emitting chip oriented frontward and a second light-emitting chip oriented rearward, each of the first and second light-emitting chips including one or more electrodes; a housing supporting the first light-emitting chip and the second light-emitting chip such that the first and second light-emitting chips respectively face frontward and rearward; and one or more connection terminals disposed in the housing and electrically connected to the one or more electrodes of the first and second light-emitting chips. Each of the one or more electrodes of the first light-emitting chip and the corresponding electrode of the second light-emitting chip are connected in common to the single corresponding connection terminal.

In a sixth embodiment according to the present invention, the first light-emitting elements and the second light-emitting elements may be alternately disposed at front and rear positions.

A seventh embodiment according to the present invention provides a method of manufacturing a transparent electronic display board including a pair of first and second transparent plates adhered to each other, with one or more light-emitting elements electrically connected and mounted to each of surfaces of the transparent plates that face each other. The method include: a transparent electrode forming operation of forming a first transparent electrode made of conductive material on a surface of the first transparent plate, and forming a second transparent electrode made of conductive material on a surface of the second transparent plate that faces the first transparent plate; a first-adhesion-hole forming operation of forming an adhesion hole in the first transparent electrode, the adhesion hole insulating partitioned portions of the first transparent electrode from each other; a first-light-emitting-element adhesion operation of charging a transparent non-conductive adhesive into the adhesion hole after the first-adhesion-hole forming operation, and electrically connecting one or more first light-emitting elements to the first transparent electrode; a second-light-emitting-element adhesion operation of electrically connecting and mounting one or more second light-emitting elements to the second transparent electrode; and a transparent plate fastening operation of charging a transparent resin into a space between the first transparent plate and the second transparent plate and adhering the first transparent plate to the second transparent plate.

In an eighth embodiment according to the present invention, the first-light-emitting-element adhesion operation may include spacing the one or more first light-emitting elements apart from each other and electrically connecting and mounting the one or more first light-emitting elements to the first transparent electrode. The second-light-emitting-element adhesion operation may include spacing the one or more second light-emitting elements apart from each other and mounting the one or more second light-emitting elements to the second transparent electrode above the first light-emitting elements such that the first and second light-emitting elements alternate each other.

According to the above-mentioned embodiments of the present invention, front light-emitting elements and rear light-emitting elements or front light-emitting elements or both-sided light-emitting elements are respectively mounted on surfaces of transparent plates that face each other. Thus, the light-emitting elements can be installed on the two different transparent plates regardless of the installation areas of transparent electrodes. Thereby, the distance between the light-emitting elements can be reduced, and the density of light can be markedly increased. Consequently, the present invention can markedly improve the image quality of a video.

DESCRIPTION OF DRAWINGS

FIG. 9 illustrates a method of manufacturing the transparent electronic display board according to the present invention.

DETAILED DESCRIPTION

A transparent electronic display board according to a first embodiment of the present invention includes: a first transparent plate and a second transparent plate facing each other at positions spaced apart from each other by a predetermined distance; a first transparent electrode and a second transparent electrode respectively provided on surfaces of the first and second transparent plates that face each other; one or more first light-emitting elements mounted on the first transparent plate and electrically connected to the first transparent electrode, the first light-emitting elements emitting light toward the second transparent plate; one or more second light-emitting elements mounted on the second transparent plate and electrically connected to the second transparent electrode, the second light-emitting elements emitting light toward the second transparent plate; and a transparent resin charging into a space between the first transparent plate and the second transparent plate and fastening the first and second transparent plates to each other.

MODE FOR INVENTION

Hereinafter, a transparent electronic display board and a method of manufacturing the same according to the present invention will be described in detail with reference to the attached drawings.

Figure 3:
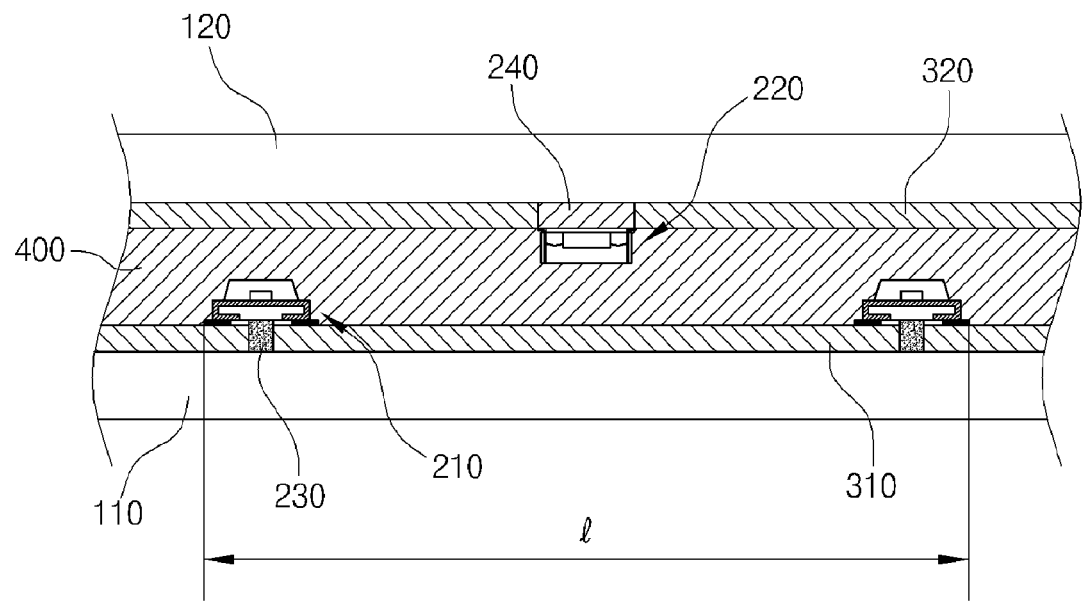
FIG. 3 is a sectional view illustrating a transparent electronic display board according to the present invention.

FIG. 3 is a sectional view illustrating a transparent electronic display board according to the present invention.

Referring to FIG. 3, the transparent electronic display board according to the present invention includes: a pair of transparent plates 110 and 120 including a first transparent plate 110 and a second transparent plate 120 that are spaced apart from each other by a predetermined distance; a first transparent electrode 310 fastened to an upper surface of the first transparent plate 110 of the transparent plates 110 and 120; a second transparent electrode 320 fastened to a surface of the second transparent plate 120; a first light-emitting element 210 connected to the first transparent electrode 310; a second light-emitting element 220 connected to the second transparent electrode 320; and a transparent resin 400 that is charged into space between the first transparent plate 110 and the second transparent plate 120 and is hardened to adhere the first transparent plate 110 to the second transparent plate 120.

The first transparent plate 110 faces the second transparent plate 120 with a space formed therebetween and is adhered to the second transparent plate 120 by the transparent resin 400.

The transparent electrodes 310 and 320 include: the first transparent electrode 310 that is formed by applying a conductive material to the surface of the first transparent plate 110 that faces the second transparent plate 120; and the second transparent electrode 320 that is formed by applying a conductive material to the surface of the second transparent plate 120 that faces the first transparent plate 110.

The first transparent electrode 310 transmits electric signals to the first light-emitting element 210. The second transparent electrode 320 transmits electric signals to the second light-emitting element 220.

Each of the first and second transparent electrodes 310 and 320 are divided into a plurality of wires that are insulated from each other and are connected to corresponding polarities of the light-emitting element 210, 220. For example, the transparent electrodes 310 and 320 are formed of conductive materials applied to the entirety of the respective surfaces of the first and second transparent plates 110 and 120 that face each other. Each transparent electrode 310, 320 is divided into a plurality of wires that are connected to corresponding electrodes depending on the location and electrodes of the light-emitting element. The wires are insulated from each other by transparent non-conductive material.

For instance, connection terminals (23, refer to FIG. 23) connected to the respective electrodes of the first light-emitting element 210 are respectively connected to the corresponding wires of the first transparent electrode 310. The wires of the first transparent electrode 310 are insulated from each other by a first transparent non-conductive adhesive 230 that is charged into an adhesion hole formed in a portion of the first transparent electrode 310. Here, the first transparent non-conductive adhesive 230 is closely fixed to a rear surface of the first light-emitting element 210.

Figure 1:
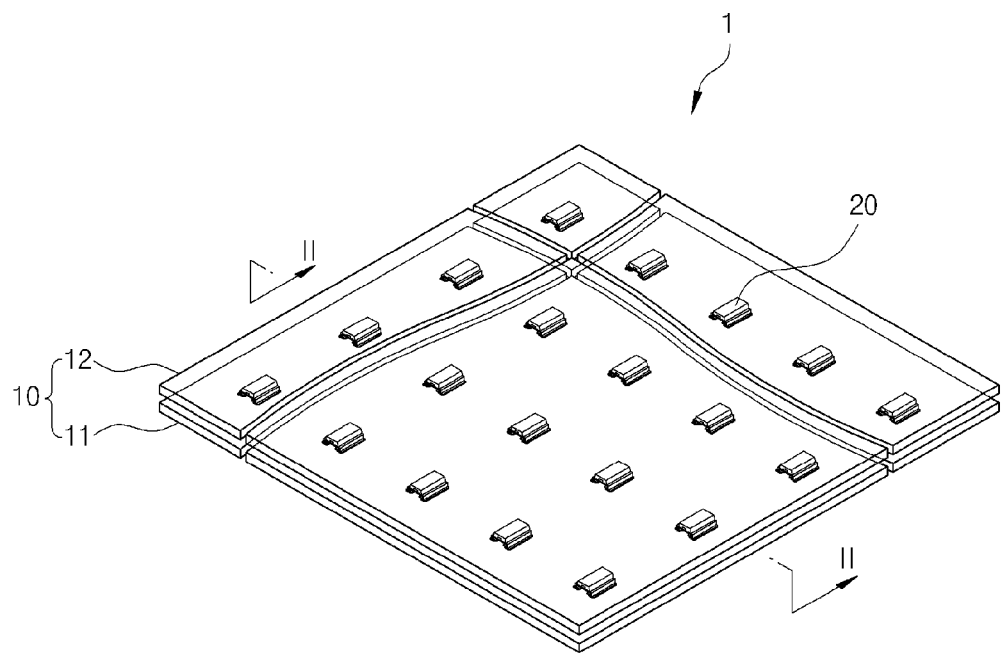
FIG. 1 is a perspective view showing a conventional transparent electronic display board.
Figure 2:
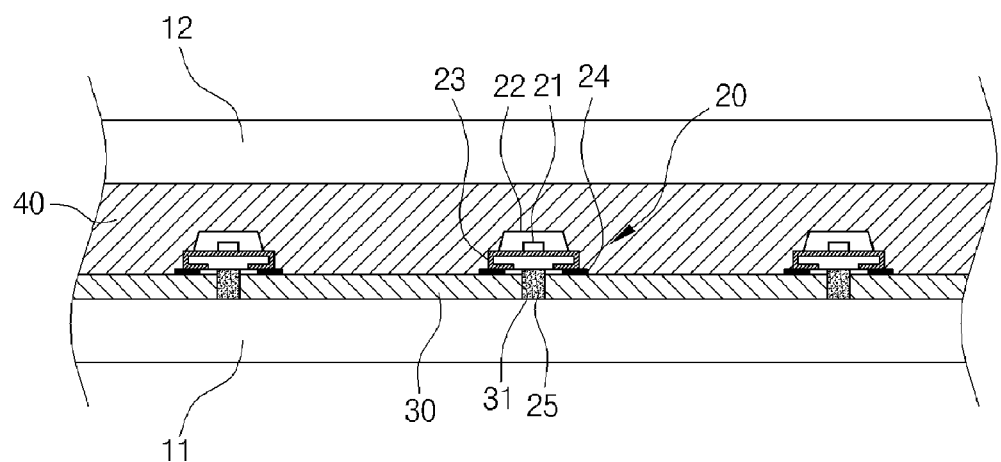
FIG. 2 is a sectional view of the conventional transparent electronic display board.

The second transparent electrode 320 has an adhesion hole, in which conductive material is not present, at a position at which the second light-emitting element 220 is adhered to the second transparent electrode 320. The adhesion hole of the second transparent electrode 320 is filled with a second transparent non-conductive adhesive 240 so that the second light-emitting element 220 is closely fixed to the surface of the second transparent plate 120. Alternatively, without using the second transparent non-conductive adhesive 240, the second light-emitting element 220 may be adhered to the second transparent electrode 320 by applying a transparent conductive adhesive (24, refer to FIG. 2) to connection terminals 222 and 222' of the second light-emitting element 220, which will be explained later herein.

The first light-emitting element 210 is adhered to the upper surface of the first transparent electrode 310 by the transparent conductive adhesive such that electricity can be transmitted from the first transparent electrode 310 to the first light-emitting element 210. The first light-emitting element 210 emits light by means of electric signal transmitted from the first transparent electrode 310. The first light-emitting element 210 is a front light-emitting element that outputs emitted light forward. In this embodiment, one or more first light-emitting elements 210 spaced apart from each other and oriented toward the second transparent plate 120 are provided on the first transparent plate 110.

Each front light-emitting element includes a light emitting chip 221 that emits light toward the second transparent plate 120. The front light-emitting element is adhered at the rear surface thereof to the first transparent electrode 310 by the transparent non-conductive adhesive 230 charged into the adhesion hole.

The second light-emitting element 220, 220' is connected to the second transparent electrode 320 by the transparent conductive adhesive such that electricity can be transmitted from the second transparent electrode 320 to the second light-emitting element 220, 220'. The second light-emitting element 220, 220' is adhered to the surface of the second transparent plate 120 by the non-conductive transparent resin 400, 400'. The second light-emitting element 220, 220' is a rear light-emitting element. In this embodiment, one or more rear light-emitting elements spaced apart from each other are adhered to the second transparent plate 120.

The second light-emitting element 220, 220' may be configured such that the connection terminals thereof, which will be explained later herein, are fixed to the second transparent electrode by a conductive adhesive. Furthermore, the second light-emitting element 220, 220' may be configured such that, in conjunction with the adhesion of the connection terminals, the rear surface thereof is adhered to the second transparent electrode by the transparent non-conductive adhesive 240 charged into the adhesion hole formed to insulate the divided portions of the second transparent electrode from each other. Here, the rear surface of the second light-emitting element refers to the direction in which light is output.

Each rear light-emitting element includes a light-emitting chip 221 oriented toward one surface of the second transparent plate 120. The rear light-emitting element is adhered at the rear surface thereof to the second transparent electrode 320. That is, the front light-emitting element outputs light from the front surface thereof and is adhered and connected at the rear surface thereof to the first transparent electrode 310; however, the rear light-emitting element is adhered and connected at the rear surface thereof to the second transparent electrode 320 and outputs light from the rear surface thereof.

Therefore, the first light-emitting element 210 and the second light-emitting element 220 output light from the first transparent plate 110 toward the second transparent plate 120. That is, light output from the first light-emitting element 210 is emitted to the outside via the transparent resin 400 and the second transparent plate 120. Light output from the second light-emitting element 220 is emitted to the outside via the second transparent plate 120.

Preferably, the one or more first light-emitting elements 210 and the one or more second light-emitting elements 220 are respectively arranged on and connected to the first transparent electrode and the second transparent electrode. The first and second light-emitting elements 210 and 220 are alternately disposed at the front and rear positions. For example, a first one of the second light-emitting element 220 is disposed between first and second ones of the first light-emitting elements 210. A second one of the second light-emitting elements 220, 220' is disposed just above an intermediate position between the second and third ones of the first light-emitting elements 210.

As such, because the first light-emitting elements 210 and the second light-emitting elements 220 are alternately disposed, the overall distance between the light-emitting elements provided in the transparent electronic display board can be reduced. Compared to the conventional technique, a reduction in distance between the light-emitting elements makes it possible to increase the number of light-emitting elements that can be installed per unit area. Therefore, the present invention can overcome the problems in setting the areas of the transparent electrode on the transparent plate having a limited area and the problem of a limited number of light-emitting elements. Thereby, the present invention can markedly improve the quality of an image.

As shown in FIG. 3, the first light-emitting element 210 has been illustrated as being the front light-emitting element, and the second light-emitting element 220 has been illustrated as being rear light-emitting element. However, using the second light-emitting elements 220, 220' as either the rear light-emitting elements or the both-sided light-emitting elements or using both the first light-emitting elements 210 and the second light-emitting elements 220, 220' as the both-sided light-emitting elements, depending on requirements of a designer or operator, also falls within the technical bounds of the present invention.

Each first light-emitting element 210 includes: the light-emitting chip on which an anode electrode and a cathode electrode are formed; and one or more connection terminals that electrically connect the light-emitting chip to the first transparent electrode 310.

Each of the first and second light-emitting elements 210 and 220 comprises any one of a two-electrode light emitting element having one anode electrode and one cathode electrode, a three-electrode light emitting element having two anode electrodes and one cathode electrode, and a four-electrode light emitting element 20 having three anode electrodes and one cathode electrode.

The constructions of the first light-emitting element 210 and the second light-emitting element 220, 220' will be described in more detail with reference to FIGS. 4 through 8.

Figure 4:
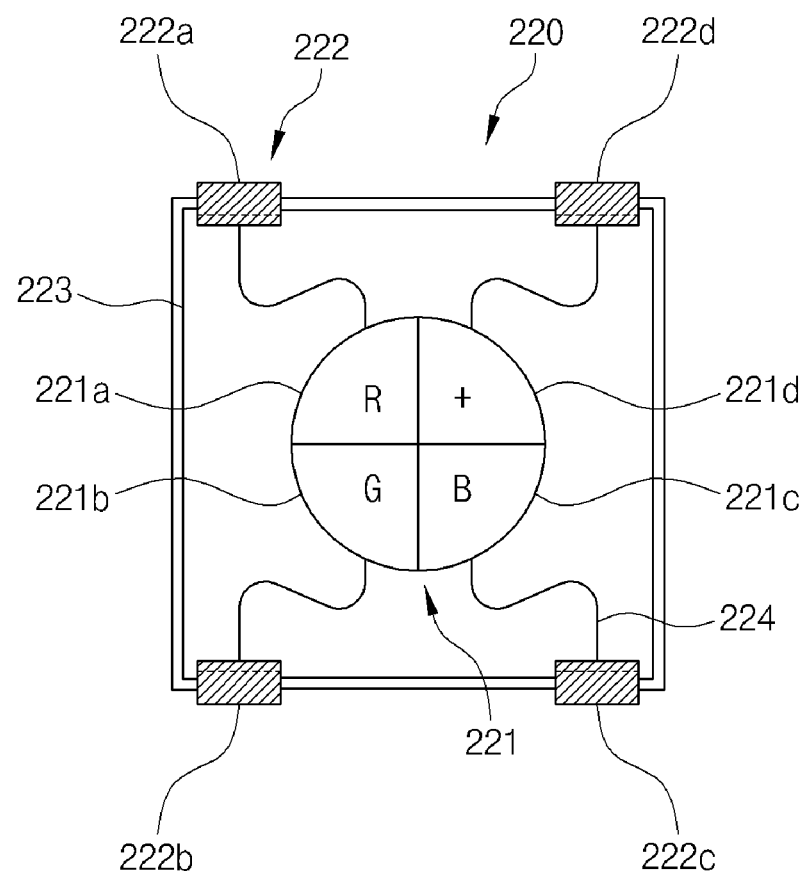
FIGS. 4 and 5 are front views showing a rear light-emitting element of the transparent electronic display board according to the present invention.
Figure 5:
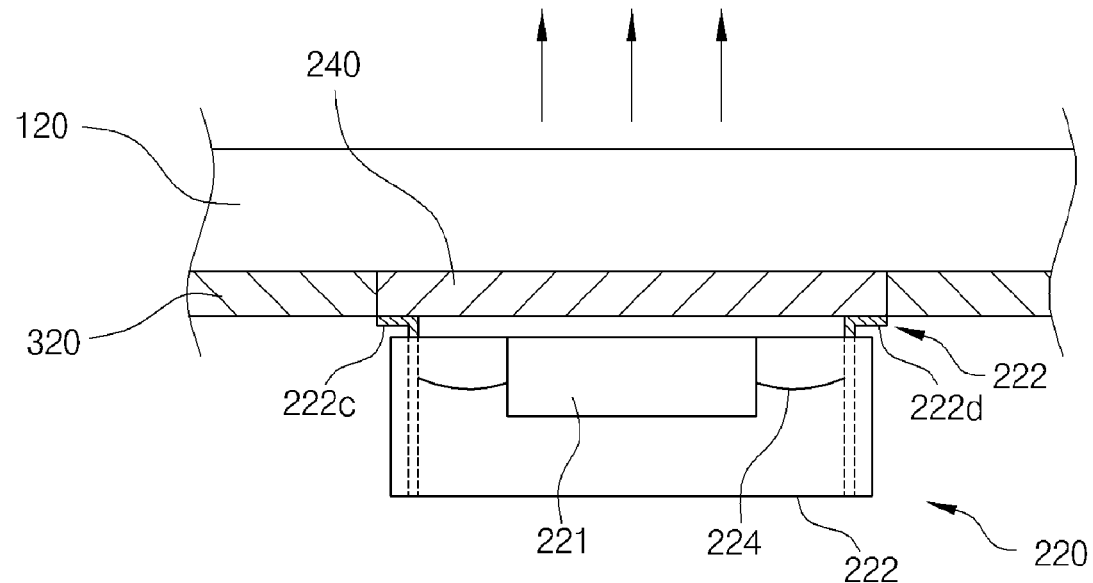

FIG. 4 is a front view illustrating the rear light-emitting element of the transparent electronic display board according to the present invention. FIG. 5 is a side sectional view showing the rear light-emitting element fastened to the second transparent plate of the transparent electronic display board according to the present invention.

Referring to FIGS. 4 and 5, each rear light-emitting element that is the second light-emitting element 220 includes: the light-emitting chip 221 emitting RGB lights; connection terminals 221 that are respectively connected to anode electrodes 221*a*, 221*b*, and 221*c* and a cathode electrode 221*d* of the light-emitting chip 221; and a housing 223 that houses the light-emitting chip 221 and the connection terminal 221 therein.

The light-emitting chip 221 is a four-electrode chip, including three anode electrodes 221*a*, 221*b*, and 221*c* and a single cathode electrode 221*d* that are respectively connected to connection terminals 221*a* through 221*d*. The light-emitting chip 221 is mounted on a support means such as a lead frame (not shown). The light-emitting chip 221 outputs light to the outside through a transparent lens (not shown) that is formed on the front surface of the housing 223 and is made of transparent material such as transparent epoxy.

The connection terminals 221 are uprightly fastened in the housing 223 and are electrically connected to the respective wires of the second transparent electrode 320 by conductive adhesive. Each connection terminal 221 is bent at an end thereof in an 'L' shape so that the end of the connection terminal 221 comes into close contact with an upper surface of the second transparent electrode 320. The end of the connection terminal 221 is adhered to the second transparent electrode 320 by conductive adhesive. The wires of the second transparent electrode 320 that are respectively adhered to the connection terminals 221 are insulated from each other by the second transparent non-conductive adhesive 240.

Furthermore, the connection terminals 221 are respectively connected to the four electrodes of the light-emitting chip 221 by the wires 224, each of which has a micro-sized diameter. Preferably, the connection terminals 221 are integrally formed with the lead frame on which the light-emitting chip 221 is mounted.

The housing 223 has in a rear surface thereof a transparent lens (not shown) through which light emitted from the light-emitting chip 221 passes. The support means such as the lead frame (not shown), on which the light-emitting chip 221 is mounted, is fixed in the housing 223. Furthermore, the housing 223 fixes the connection terminals 222 in place in such a way that the ends of the connection terminals 222 extend toward the rear surface of the housing 223.

The operation of emitting light using the rear light-emitting element having the above-mentioned construction will be explained below.

The second light-emitting element (rear light-emitting element) 220 is adhered to the surface of the second transparent plate 120 by the second transparent non-conductive adhesive 240 charged into the adhesion hole that is provided to separate the second transparent electrodes 320 from each other.

Alternatively, the connection terminals of the second light-emitting element 220' are adhered to the respective second transparent electrodes 320. Here, adhesion using the second transparent non-conductive adhesive 240 may be omitted, or both kinds of adhesion methods may be used.

The connection terminals 222 are uprightly fixed in the second light-emitting element 220. The end of each second transparent electrode 320 that is bent to make close contact with the upper surface of the second transparent electrode 320 is adhered to the second transparent electrode 320 by conductive adhesive.

Here, the second transparent non-conductive adhesive 240 functions to interrupt transmission of electricity. The conductive adhesive allows electric signals to be transmitted between elements. Techniques pertaining to these adhesives are well known; therefore, further explanation for chemical composition, a mixing ratio and an adhesion method will be omitted.

When electric signals are applied to the corresponding connection terminals 222 through the second transparent electrode 320, the second light-emitting element 220 emits light in response to the electric signals transmitted to the three anode electrodes 221a, 221b and 221c connected to the corresponding connection terminals 222a through 222d. Light emitted from the second light-emitting element 220 is output to the outside through the second transparent plate 120 via the transparent lens disposed above the light-emitting chip 221.

As such, the second light-emitting element 220 is adhered at the rear surface thereof to the second transparent electrode 320 and outputs light through the rear surface thereof. Therefore, the second light-emitting element 220 can output light in the same direction as that of the first light-emitting element 210 fastened to the first transparent plate 110. Consequently, the number of pixels per unit area can be increased.

Meanwhile, the construction of the both-sided light-emitting element will be explained with reference to FIGS. 6 through 8. The both-sided light-emitting element illustrated in the drawings is well known; therefore, the construction and operation thereof will be explained in brief.

Figure 6:
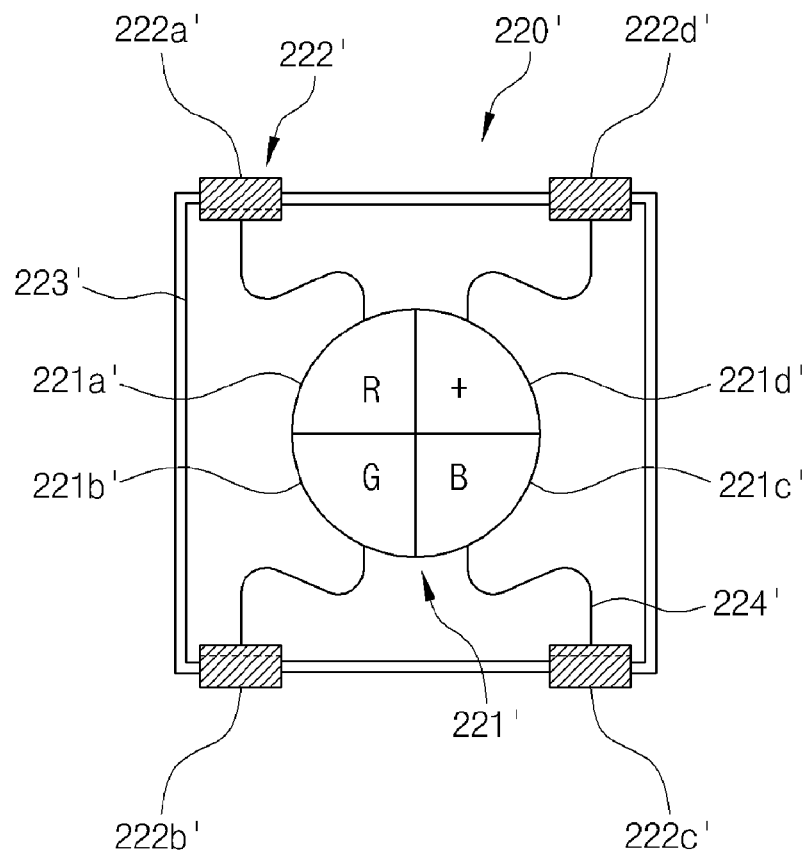
FIGS. 6 and 7 are front views showing a double-sided light-emitting element of another embodiment of the transparent electronic display board according to the present invention.

FIG. 6 is a front view illustrating a both-sided light-emitting element of another embodiment of the transparent electronic display board according to the present invention. FIG. 7 is a rear view of the both-sided light-emitting element. FIG. 8 is a side sectional view showing the double-sided light-emitting element fastened to the second transparent plate.

Figure 7:
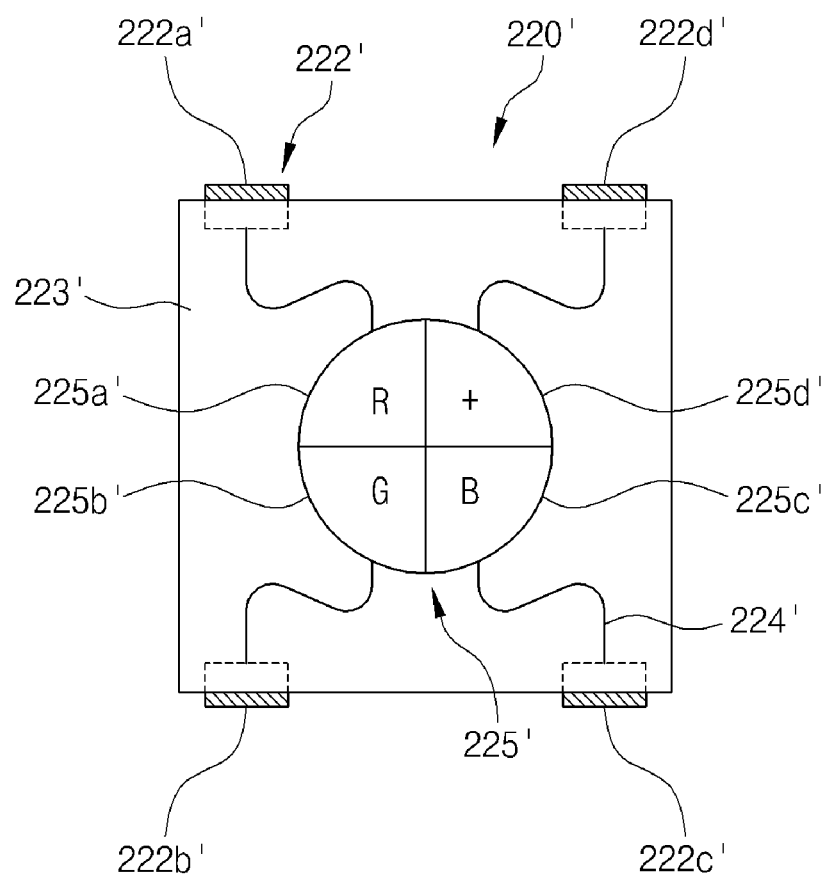
Figure 8:
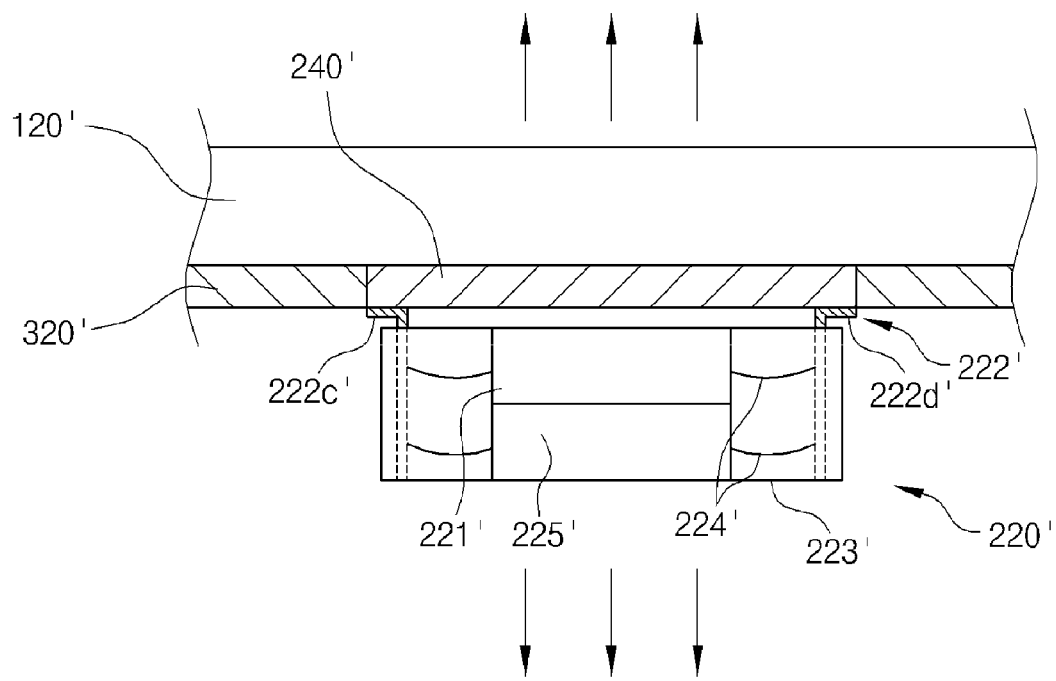
FIG. 8 is a side sectional view showing the double-sided light-emitting element of the transparent electronic display board according to the present invention.

Referring to FIGS. 6 through 8, the both-sided light-emitting element 220' includes: a first light-emitting chip 221' oriented toward the front surface of the element; a second light-emitting chip 225' oriented toward the rear surface of the element; one or more connection terminals 222' electrically connected to respective electrodes provided on the first and second light-emitting chips 221' and 225'; and a housing 223' that houses the first light-emitting chip 221', the second light-emitting chip 225', and the connection terminals 222' therein.

Each of the first and second light-emitting chips 221' and 225' may comprise any one of two-, three-, and four-electrode light emitting chips. In the following description, four-electrode light-emitting chips 221, 221', and 225' will be explained as an example.

The first light-emitting chip 221' and the second light-emitting chip 225' are insulated from each other and mounted to lead frames (not shown) and circuit boards (not shown). The same electrodes of the first and second light-emitting chips 221' and 225' are connected in common to the corresponding connection terminal 222. The first light-emitting chip 221' and the second light-emitting chip 225' emit light in the opposite directions. For example, the first light-emitting chip 221' emits light toward the second transparent plate 120'. The second light-emitting chip 225' emits light toward the first transparent plate 110'.

The housing 223' has a transparent lens (not shown) that is made of transparent material such as transparent epoxy and is disposed above the first and second light-emitting chips 221' and 225'. The housing 223' fixes the first light-emitting chip 221' and the second light-emitting chip 225' in place. Furthermore, the housing 223' supports the connection terminals 222a' through 222d' such that the connection terminals 222a' through 222d' extend toward the rear surface of the display board and adhere to the second transparent electrode 320'.

The number of connection terminals 222' is the same as the number of electrodes of each light-emitting chip 221', 225'. A rear end of each connection terminal 222' that extends toward the rear surface of the display board is bent to have an 'L' shape. The L-shaped rear end of the connection terminal 222' comes into close contact with the upper surface of the second transparent electrode 320'. The number of connection terminals 222' is the same as that of electrodes of the first or second light-emitting chip 221' or 225'. For example, when each of the first light-emitting chip 221' and the second light-emitting chip 225' has four electrodes, as described above, the connection terminals 222' also comprise four connection terminals 222a' through 222d'. A first anode electrode 221a' of the first light-emitting chip 221' and a first electrode 225a' of the second light-emitting chip 225' are connected in common to the first connection terminal 222a'. A second anode electrode 221b' of the first light-emitting chip 221' and a second anode electrode 225b' of the second light-emitting chip 225' are connected in common to the second connection terminal 222b'. A third anode electrode 221c' of the first light-emitting chip 221' and a third anode electrode 225c' of the second light-emitting chip 225' are connected in common to the third connection terminal 222c'. A cathode electrode 221d' of the first light-emitting chip 221' and a cathode electrode of the second light-emitting chip 225' are connected in common to the fourth connection terminal 222d'.

Each electrode of the first and second light-emitting chips 221' and 225' is connected to the corresponding connection terminal by a gold wire 224' having a micro-sized diameter.

In the both-sided light-emitting element 220' having the above-mentioned construction, the connection terminals 222' are fastened to the second transparent plate 120' by transparent conductive adhesive on the second transparent electrode 320' applied on the surface of the second transparent plate 120'.

The both-sided light-emitting element 220' can emit light through both the first transparent plate 110 and the second transparent plate 120'. Therefore, the both-sided light-emitting elements 220' along with the first light-emitting elements 210 provided on the first transparent plate 110 can provide a video of a high image quality and create a wider variety of display patterns.

Particularly, in the present invention, the rear light-emitting elements 220 or the both-sided light-emitting elements 220' can be selectively used so that a variety of effects can be produced. For example, when the front light-emitting elements are provided on the first light-emitting element 210 and the both-sided light-emitting elements are provided on the second light-emitting element 220, a variety of images can be produced on the front surface of the display board by light output from the front light-emitting elements and the both-sided light-emitting elements. Simultaneously, light emitted from the both-sided light-emitting elements can also be output from the rear surface of the display board. Therefore, images can be formed on both the front and rear surfaces of the transparent electronic display board.

Such effects can be further amplified if both the first light-emitting elements 210 and the second light-emitting elements 220, 220' comprise both-sided light-emitting elements. That is, as stated above, if the both-sided light-emitting elements are alternately fastened on the surfaces of the first and second transparent plates 110 and 120 that face each other, light can be simultaneously output from the front and rear surfaces of the transparent electronic display board. In this case, two videos having high image qualities can be simultaneously played.

As described above, elements selected from among the front light-emitting element, the rear light-emitting elements, and the both-sided light-emitting elements are alternately installed on the first transparent plate 110 and the second transparent plate 120, 120'. Thereby, the quality of an image output from the transparent electronic display board can be markedly improved. However, a method of manufacturing the above-described transparent electronic display board will be described in detail with reference to FIG. 9.

FIG. 9 illustrates the method of manufacturing the transparent electronic display board according to the present invention.

Referring to FIG. 9, the method of manufacturing the transparent electronic display board according to the present invention includes: (a) transparent electrode forming operation of respectively forming the first and second transparent electrodes 310 and 320 on the first transparent plate 110 and the second transparent plate 120, 120' that face each other; (b) first-adhesion-hole forming operation of forming adhesion holes in the first transparent electrode 310; (c) first-light-emitting-element adhesion operation of fastening the first light-emitting elements 210 to the first transparent electrode 310; (d) second-light-emitting-element adhesion operation of fastening the second light-emitting elements 220, 220' to the second transparent electrode 320; and (e) transparent plate fastening operation of charging transparent resin 400, 400' into space between the first transparent plate 110 and the second transparent plate 120, 120' and adhering the first transparent plate 110 to the second transparent plate 120, 120'.

In (a) transparent electrode forming operation, the transparent electrodes 310 and 320 or 320' are respectively formed by applying conductive material to the surfaces of the two transparent plates 110 and 120 or 120' that face each other. That is, the first transparent electrode 310 is formed on the corresponding surface of the first transparent plate 110. The second transparent electrode 320, 320' is formed on the corresponding surface of the second transparent plate 120.

In (b) first-adhesion-hole forming operation, the first transparent electrode 310 is partitioned into a plurality of connection wires in consideration of the locations and electrodes of the first light-emitting elements 210. The first transparent non-conductive adhesive 230 is applied between the connection wires so that the connection wires formed on the first transparent electrode 310 are insulated from each other by the first transparent non-conductive adhesive 230.

In (c) first-light-emitting-element adhesion operation, the first light-emitting elements 210 are placed on the respective first adhesion holes and then fixed to the first transparent plate 110 by hardening the first transparent non-conductive adhesive 230. The connection terminals of each first light-emitting element 210 are brought into close contact with the connection wires of the first transparent electrode 310 that are insulated from each other with the first transparent non-conductive adhesive 230 formed therebetween. The connection terminals are fastened to the corresponding connection wires of the first transparent electrode 310 by conductive adhesive. In this way, the first light-emitting element 210 is fastened to and electrically connected to the first transparent electrode 310.

In (d) second-light-emitting-element adhesion operation, the second light-emitting elements 220, 220' are adhered to and fixed to areas of the second transparent electrode on which the second transparent conductive adhesive has been applied, and/or the connection terminals 222, 222' are adhered to and fixed to the second transparent electrode 320, 320'. Each second light-emitting element 220, 220' is electrically connected to the second transparent electrode 320, 320' by fastening the connection terminals, each of which is bent on the end thereof, to the second transparent electrode 320 using conductive adhesive.

In (e) transparent plate fastening operation, the transparent resin 400, 400' is charged into space between the first transparent plate 110 to which the first light-emitting elements 210 are fastened, and the second transparent plate 120, 120' to which the second light-emitting elements 220, 220' are fastened. Thereby, the first transparent plate 110 and the second transparent plate 120, 120' are adhered to each other by the transparent resin 400, 400'. Here, the first light-emitting elements 210 are fastened to the upper surface of the first transparent plate 110. The second light-emitting elements 220, 220' are fastened to the surface of the second transparent plate 120, 120' that faces the first transparent plate 110. The first transparent plate 110 and the second transparent plate 120, 120' are adhered to each other by charging the transparent resin 400, 400' into the space therebetween and hardening it.

Preferably, the first light-emitting elements 210 and the second light-emitting elements 220, 220' are alternately disposed rather than being aligned with each other. That is, each second light-emitting element 220, 220' is disposed just above an intermediate portion of a space between the corresponding adjacent first light-emitting elements 210. Each first light-emitting element 210 is disposed just below an intermediate portion of a space between the corresponding adjacent second light-emitting elements 220, 220'.

In the present invention, the transparent electronic display board can be manufactured through the above-mentioned process. Each of the first and second light-emitting elements 210 and 220 or 220' comprises any one selected from among the front light-emitting element, the rear light-emitting element and the both-sided light-emitting element.

INDUSTRIAL APPLICABILITY

As described above, in embodiments of the present invention, front light-emitting elements and rear light-emitting elements or front light-emitting elements or both-sided light-emitting elements are respectively mounted on surfaces of transparent plates that face each other. Thus, the light-emitting elements can be installed on the two different transparent plates regardless of the installation areas of transparent electrodes. Furthermore, the distance between the light-emitting elements can be reduced, and the density of light can be markedly increased. Consequently, the present invention makes it possible to play a video using a transparent electronic display board, thus leading an increase in profits of related manufacturers.

The invention claimed is:

1. A method of manufacturing a transparent electronic display board, the method comprising:
   preparing a first and second transparent plates facing each other;
   forming a first transparent electrode made of conductive material on a surface of the first transparent plate, and forming a second transparent electrode made of conductive material on a surface of the second transparent plate;
   forming one or more first adhesion holes in the first transparent electrode, the one or more first adhesion holes insulating partitioned portions of the first transparent electrode from each other;
   forming one or more first light-emitting elements by charging a transparent non-conductive adhesive into the one or more first adhesion holes, positioning the one or more first light-emitting elements below the one or more first adhesion holes and electrically connecting the one or more first light-emitting elements to the first transparent electrode;
   forming one or more second light-emitting elements by electrically connecting and mounting the one or more second light-emitting elements to the second transparent electrode; and
   charging a transparent resin into a space where the one or more first light-emitting elements and the one or more second light-emitting elements are positioned, between the first transparent plate and the second transparent plate and adhering the first transparent plate to the second transparent plate.

2. The method of claim 1, wherein the formation of the one or more first light-emitting elements comprises spacing the one or more first light-emitting elements apart from each other and electrically connecting and mounting the one or more first light-emitting elements to the first transparent electrode; and
   the formation of the one or more second light-emitting elements comprises spacing the one or more second light-emitting elements apart from each other and mounting the one or more second light-emitting elements to the second transparent electrode above the first light-emitting elements such that the first and second light-emitting elements alternate with each other.

3. The method of claim 1, wherein the formation of the one or more second light-emitting elements comprises:
   forming one or more second adhesion holes in the second transparent electrode;
   charging a transparent non-conductive adhesive into the one or more second adhesion holes;
   positioning the one or more second light-emitting elements below the one or more second adhesion holes; and
   electrically connecting and mounting the one or more second light-emitting elements to the second transparent electrode.

4. The method of claim 1, wherein the one or more first light-emitting elements emits the light toward only the second transparent plate, and the one or more second light-emitting elements emit the light toward only the second transparent plate.

5. The method of claim 1, wherein the one or more first light-emitting elements are electrically connected to the first transparent electrode and not to the second transparent electrode; and
   the one or more second light-emitting elements are electrically connected to the second transparent electrode and not to the first transparent electrode.

* * * * *